(12) United States Patent
Gailhard et al.

(10) Patent No.: US 6,703,880 B1
(45) Date of Patent: Mar. 9, 2004

(54) GENERATOR FOR THE PRODUCTION OF CLOCK SIGNALS

(75) Inventors: Bruno Gailhard, Trets (FR); Olivier Ferrand, Puyloubier (FR)

(73) Assignee: STMicroelectronics SA, Montrouge (FR)

(*) Notice: Subject to any disclaimer, the term of this patent is extended or adjusted under 35 U.S.C. 154(b) by 83 days.

(21) Appl. No.: 10/013,343

(22) Filed: Oct. 30, 2001

(30) Foreign Application Priority Data

Oct. 30, 2000 (FR) .............................. 00 13903

(51) Int. Cl.[7] .............................. H03L 7/06
(52) U.S. Cl. ................. 327/159; 327/160; 375/376; 331/DIG. 2
(58) Field of Search ................. 327/146–151, 327/155–159, 160; 331/1 A, DIG. 2, 18; 375/373–376

(56) References Cited

U.S. PATENT DOCUMENTS

| | | | |
|---|---|---|---|
| 4,380,742 A | | 4/1983 | Hart ..................... 331/1 A |
| 4,817,199 A | * | 3/1989 | Wallraff .................. 455/260 |
| 6,066,988 A | * | 5/2000 | Igura ....................... 331/18 |
| 6,285,260 B1 | * | 9/2001 | Kikugawa ................ 331/1 A |
| 6,456,132 B1 | * | 9/2002 | Kouzuma ................. 327/159 |

FOREIGN PATENT DOCUMENTS

| | | |
|---|---|---|
| CH | 670020 | 4/1989 |
| EP | 0012899 | 7/1980 |
| GB | 2236922 | 4/1991 |

* cited by examiner

*Primary Examiner*—Minh Nguyen
(74) *Attorney, Agent, or Firm*—Allen, Dyer, Doppelt Milbrath & Gilchrist, P.A.; Lisa K. Jorgenson

(57) ABSTRACT

An integrated circuit includes a generator for providing a clock signal from a reference signal. The generator, which is of the phase-locked loop type, includes a frequency divider and a phase comparator connected together. A reset circuit is connected to the frequency divider and to the phase comparator for providing a reset signal thereto at each leading edge of the reference signal for synchronizing a low-frequency signal with the reference signal.

37 Claims, 3 Drawing Sheets

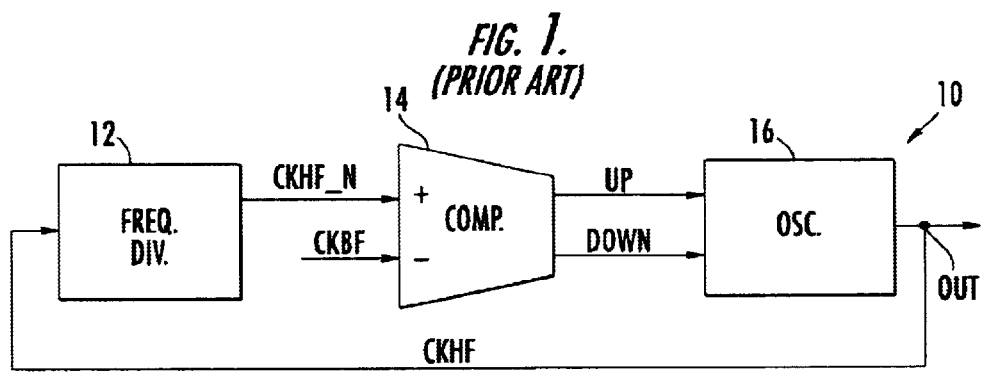
FIG. 1. (PRIOR ART)
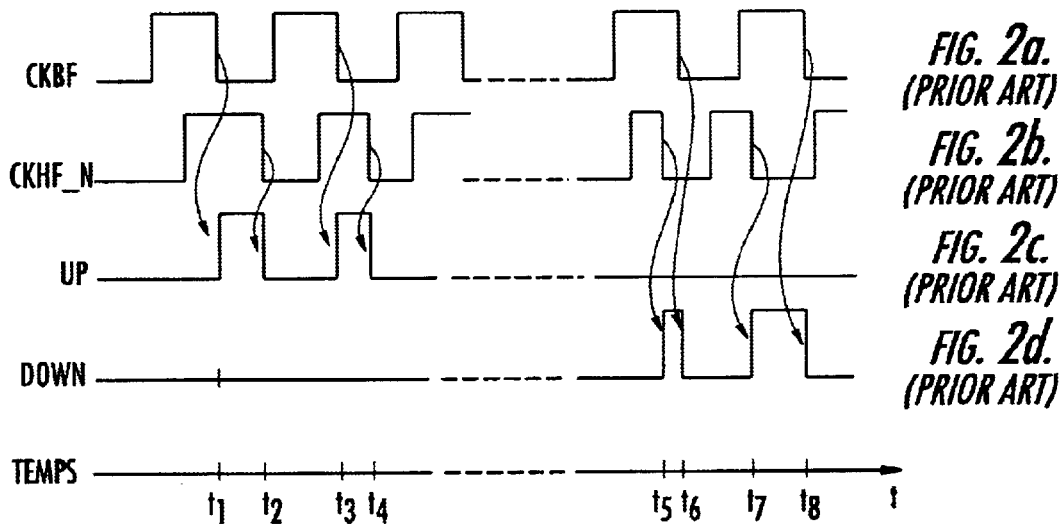
FIG. 2a. (PRIOR ART)
FIG. 2b. (PRIOR ART)
FIG. 2c. (PRIOR ART)
FIG. 2d. (PRIOR ART)
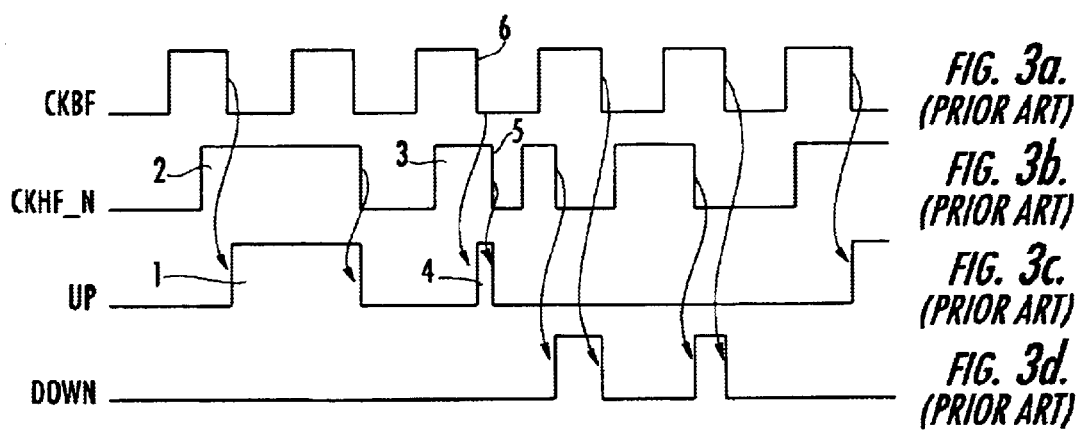
FIG. 3a. (PRIOR ART)
FIG. 3b. (PRIOR ART)
FIG. 3c. (PRIOR ART)
FIG. 3d. (PRIOR ART)

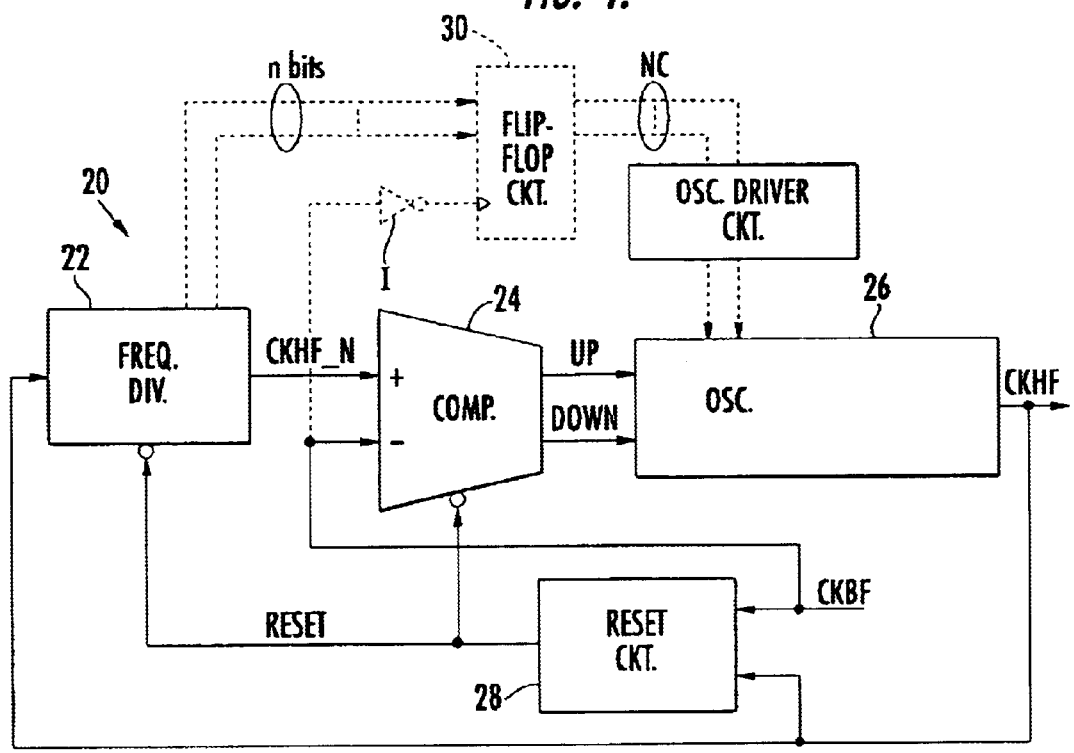
FIG. 4.
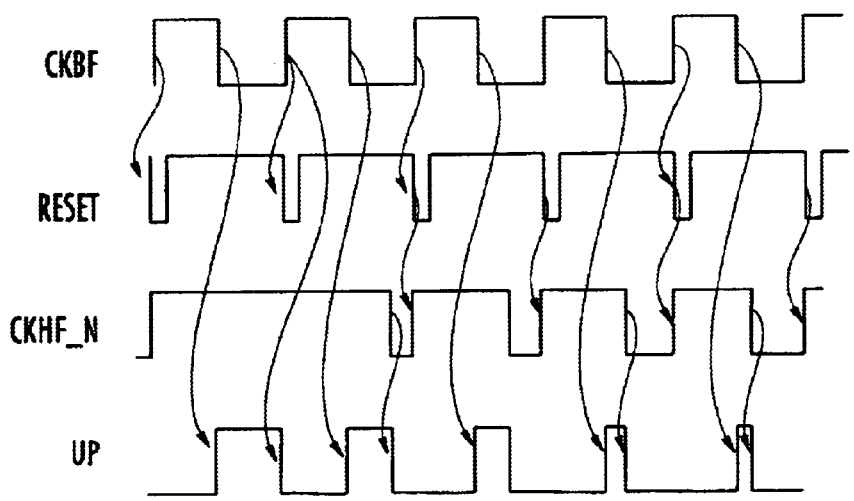
FIG. 5a.
FIG. 5b.
FIG. 5c.
FIG. 5d.

GENERATOR FOR THE PRODUCTION OF CLOCK SIGNALS

FIELD OF THE INVENTION

The invention relates to phase-locked loop type clock-signal generators that produce a high-frequency clock signal from a low-frequency clock signal. Among these generators, the invention relates more specifically to those using an oscillator comprising series connected inverters.

BACKGROUND OF THE INVENTION

A prior art generator 10 of this kind as shown in FIG. 1 includes a frequency divider 12, a phase comparator 14 and an oscillator 16 that are series connected. An output OUT of the oscillator 16 is connected to an input of the frequency divider 12. The loop 10 gives a high-frequency clock signal CKHF (f=FHF) as a function of a reference low-frequency signal CKBF (f=FBF).

The frequency divider 12 receives the clock signal CKHF and gives a signal CKHF_N that is an image of the signal CKHF, and has a frequency equal to f=FHF/N. N is an integer whose value is chosen as a function of the desired frequency FHF0 for the clock signal CKHF, and of the frequency FBF of the reference signal CKBF used: N=FHF0/FBF.

The phase comparator 14 has a positive input and a negative input. The signals CKHF_N and CKBF are respectively applied to these inputs. When the signals CKHF_N and CKBF are equal to 1, the phase comparator 14 determines the phase difference between the signal CKHF_N and CKBF by comparing the relative position of the trailing edges of the clock signal CKHF_N and CKBF. The comparator then produces two logic control signals UP, DOWN as a function of the result of the comparison.

The signals UP, DOWN have the following characteristics. If a trailing edge of CKBF is detected first (instants T1 and T3 in FIGS. 2a to 2d), and the signals CKHF_N and CKBF are previously at a 1, CKBF has a phase lead over CKHF_N. The comparator 14 then gives an active signal UP which, for example, takes the logic value 1. UP is then deactivated on the next trailing edge of the CKHF_N (instants T2 and T4 in FIGS. 2a to 2d).

If a trailing edge of CKHF_N is detected first (instants T5 and T7 in FIGS. 2a to 2d), and the signals CKHF_N and CKBF are previously at a 1, CKBF has a phase delay with respect to CKHF_N. The comparator 14 then gives an active signal DOWN which, for example, takes the logic value 1. DOWN is then deactivated on the next trailing edge of CKBF (instants T6 and T8 in FIGS. 2a to 2d). Otherwise, the signals UP, DOWN remained constant, active or inactive as the case may be.

The oscillator 16 receives the command signals UP, DOWN and, at its output OUT, it gives the clock signal CKHF. Two types of known oscillators used to form a clock signal generator of the kind are shown in FIG. 1. A first type of oscillator, known as an analog oscillator, comprises a voltage generator and a chain of inverters. The voltage generator produces a controlled voltage VC which is a rising voltage if OUT is active, a falling voltage if DOWN is active, and if not, a constant voltage.

The variation ΔVC of the controlled voltage VC is proportional to the duration of the signals UP, DOWN. In the case of an analog oscillator, the chain of inverters comprises a fixed odd number of series connected identical inverters. A data output of the first inverter is connected to a data input of the last inverter. The chain of inverters produces the clock signal CKHF whose frequency FHF is proportional to the number of inverters in the chain, and to the switching time in the inverters. The switching time of the inverters is itself proportional to the variation ΔVC of the control voltage given by the voltage generator.

The frequency FHF of the clock signal CKHF obtained thus follows the variations of the controlled voltage and, therefore, those of the control signals UP, DOWN: FHF increases if the signal UP is active, FHF decreases if the signal DOWN is active, FHF is constant if the signals UP, DOWN are inactive.

A second type of oscillator, known as the digital oscillator, comprises an up/down counter and a chain of inverters. The up/down counter produces a control number NR whose value varies as a function of the signals UP, DOWN: NR decreases if the signal UP is active, NR increases if the signal DOWN is active, and NR is constant if the signals UP, DOWN are inactive. The variations ΔNR of the control number NR are proportional to the duration of the pulses UP, DOWN.

In the case of the digital oscillator, the inverters of the chain of inverters are all identical and, in particular, they have identical propagation times Δtd. However, the total number ND of inverters in the chain is variable as a function of the control number NR given by the counter. The variations ΔAND and ND are proportional to the variations of the control number NR.

Since the frequency FHF of the signal CKHF obtained is universally proportional to the number of inverters present in the chain, it varies as a function of the number given by the up/down counter, and therefore, as a function of the signals UP, DOWN as follows: FHF increases if the signal UP is active, FHF decreases if the signal DOWN is active, and FHF is constant if the signals UP, DOWN are inactive.

Thus, regardless of the oscillator chosen, whether analog or digital, the variation ΔFHF of the frequency FHF generated by a pulse UP, DOWN is proportional to the duration ΔUP, ΔDOWN of the signal UP, DOWN applied: ΔFHF=K*ΔUP or ΔAF=K*ΔDOWN.

The general functioning of the clock signal generator 10 is as follows. If a trailing edge of CKBF is detected first (instants Ti and T3 in FIGS. 2a to 2d), the signals CKHF_N, with CKBF being previously at a 1, CKBF has a phase lead over CKHF_N. It is estimated in this case that the frequency of the CKHF_N is lower than that of CKBF. That is, the frequency of CKHF is lower than the desired value FHF0=N*FBF. The comparator 14 then gives an active signal UP and the frequency FHF of the clock signal CKHF rises. UP is then deactivated on the next trailing edge of CKHF_N (instants Ti and T3 in FIGS. 2a to 2d). The duration of the signal UP applied is thus proportional to the phase difference between CKHF_N and CKBF.

Conversely, if a trailing edge of CKHF_N is detected first (instants T5 and T7 in FIGS. 2a to 2d), with the signals CKHF_N and CKBF being previously at a 1, CKBF has a phase delay with respect to CKHF_N. In this case, it is estimated that the frequency of the CKHF_N is higher than that of CKBF. That is, the frequency of CKHF is higher than the desired value FHF0=N*FBF. The comparator 14 then gives an active signal DOWN and the frequency of the clock signal CKHF decreases. DOWN is then deactivated on the next trailing edge of CKBF (instants T6 and T8 in FIGS. 2a to 2d). The duration of the signal DOWN applied is thus proportional to the phase difference between the signals CKHF_N and CKBF.

When the generator 10 is powered on, the frequency FHF of the signal CKHF is very low. For example, it is equal to the frequency FBF of the reference signal CKBF. The frequency FHF will then vary as a function of the pulses UP, DOWN produced by the phase comparator. It will increase on an average because the pulses UP are more numerous and their duration is greater than that of the pulses DOWN. The frequency FHF will finally converge towards its borderline value FHF0. The variations ΔFHF of the frequency FHF are a function of the duration ΔUP, ΔDOWN, of the pulses UP and DOWN, which is itself proportional to the phase difference between the signals CKHF_N and CKBF. It may be recalled that the frequency of CKFH_N is equal to FHF/N.

The duration of the pulses UP, DOWN is random with respect to the difference in frequency δ between the real frequency FHF of the signal CKHF and the desired frequency FHF0 (δF=FHF=−FHF0). This sometimes leads to an excessively large increase or an excessively large decrease in the frequency FHF. That is, major oscillations of the frequency FHF, especially when this frequency is close to its borderline value FHF0.

For example, if a pulse UP with a large duration is applied (reference numeral 1 in FIGS. 3a to 3d), when the frequency FHF is below its borderline value FHF0 (reference numeral 2 in FIGS. 3a to 3d), then the frequency FHF can increase excessively and become higher than FHF0 (reference numeral 3). In the example, however, another pulse UP appears (reference numeral 4). This pulse UP is due to the difference in phase between the signal CKHF_N (reference numeral 5) and the signal CKBF (reference numeral 6). The frequency FHF is further raised whereas it would have been necessary to lower it.

These oscillations of the frequency FHF may have varying amplitudes and durations. Due to these oscillations, the convergence time of the generator 10, namely the time needed for the frequency FHF to reach its borderline value FHF0, is relatively lengthy.

Since the variation ΔFHF of the frequency FHF is proportional to the duration ΔUP, ΔDOWN of the pulses UP, DOWN, it is possible to choose a small coefficient K of proportionality between the two to limit the amplitude of the oscillations of the frequency FHF.

However, this coefficient K cannot be excessively reduced. Nor can the duration of the pulses UP, DOWN be reduced below a minimum value. Consequently, the phase difference between the signals CKHF_N and CKBF is never completely 0, and the amplitude of the oscillations of FHF cannot be reduced below a minimum value, even after the convergence. Furthermore, if the coefficient of proportionality is too small, the time to obtain the convergence is important.

Should an analog oscillator be used, a filter placed at output of the voltage generator may be used to filter the control voltage, and thus eliminate the variations in the control voltage due to the weakest pulses UP, DOWN. While a filter of this kind is efficient in reducing the amplitude of the oscillations in frequency, especially after the convergence, it takes up a large amount of silicon surface area.

The amplitude and the duration of the oscillations of the frequency FHF, as well as the convergence time, depend especially on the frequency FBF of the reference signal and indirectly on the number N.

The convergence time is in the range of 100 to 500 periods of the reference signal CKBF. If the frequency FBF of the reference signal CKBF is high enough, then the number N is relatively low, in the range of 10 to 50. The oscillations have a low amplitude, and the convergence is fairly rapid and the desired frequency FHF0 is quickly reached. However, if the frequency FBF is relatively low, then the number N is relatively high, in the range of 200, and the oscillations are large and the convergence time soon becomes prohibitive.

Thus, if a very high value of frequency is desired for FHF, for example, in the range of 48 MHZ, then it is necessary to choose a reference signal CKBF with a mean frequency, for example, in the range of 1 MHZ, to make efficient use of the known circuits.

However, it would be useful to be able to use a very low frequency reference signal CKBF, in the range of 10 Hz to 50 kHz, for example, especially for reasons of cost. A reference signal of this kind could be obtained from a particularly stable quartz crystal generator (FBF in the range of 32 kHz) or else from a national electrical power system, which has a signal frequency of 50 Hz, for example, that is also stable. Other sources of low-frequency and low-cost reference signals may also be considered.

SUMMARY OF THE INVENTION

In view of the foregoing background, an object of the invention is to provide a phase-locked loop type of clock signal generator wherein the convergence time is reduced as compared with that of known circuits.

Another object of the invention is to provide a clock signal generator that uses very low frequency reference signals to obtain very high frequency clock signals.

These and other objects, advantages and features according to the invention are provided by an integrated circuit comprising a generator for producing a clock signal from a reference signal, with the generator comprising a frequency divider to give a low-frequency signal that is an image of the clock signal, and a comparator to compare the phase of the low-frequency signal with that of the reference signal and give a control signal as a function of the result of the comparison.

The generator further includes an oscillator, to produce the high-frequency signal (CKHF) from the control signal, and a reset circuit to give a reset signal at each leading edge of the reference signal to synchronize the low-frequency signal with the reference signal.

The integrated circuit further comprises an oscillator driving means to modulate a value of a coefficient of proportionality as a function of the result of the comparison. A variation of the frequency of the high-frequency signal is equal to the duration of the control signal multiplied by the coefficient of proportionality.

The idea of the invention thus is to use a reset circuit to synchronize the low-frequency signal (the image of the high frequency signal) with the reference signal. After synchronization, the relative phase difference detected by the phase comparator between the trailing edges of the low-frequency signal and those of the reference signal is then directly proportional to the frequency difference between these two signals.

The duration of the control signal produced by the comparator is therefore directly proportional to the difference between the real frequency FHF of the clock signal and its desired borderline value FHF0. The duration of the control signal is therefore always large if the difference between FHF and FHF0 is large. Conversely, the duration of the control signal is always small when the difference between FHF and FHF0 is small. It is thus far easier to manage the variations in the frequency FHF of the clock signal.

The variations in the frequency FHF are restricted with the invention. This feature accordingly limits the risks of going beyond the desired borderline value of FHF0 by excessively raising (or, as the case may be, excessively lowering) the frequency FHF by the application of an excessively lengthy control signal. Consequently, the phenomenon presented above (FIGS. 3a to 3d) is eliminated. The oscillations of the high-frequency signal are greatly reduced, and the number of active pulses of the control signal is also limited, and the convergence time is consequently reduced. It is no longer necessary to filter the signals.

The reset signal is used to synchronize the low-frequency signal with the reference signal by resetting the frequency divider. The reset signal, as the case may be, may be applied additionally to an input of the comparator to deactivate the control signal at each leading edge of the reference signal.

According to one embodiment, the reset circuit comprises a first flip-flop circuit having a data input to which the reference signal is applied, a clock input to which the clock signal is applied, and a data output. A first logic gate comprises two inputs respectively connected to the data input and to the data output of the first flip-flop circuit, and an output at which the reset signal is given. The reset signal is thus activated on a leading edge of the reference signal and deactivated on a leading edge of the clock signal.

According to one embodiment, the divider comprises a counter to count pulses of the high-frequency signal and give a stop signal when the number of pulses counted reaches the desired number N/2. A second flip-flop circuit has a clock input to which the stop signal is applied, and a negative data output connected to a data input of the second flip-flop circuit. The second flip-flop circuit provides the low-frequency signal at its negative output. A second logic gate has two inputs to which there are respectively applied the stop signal by an inverter and the reset signal. The second logic signal produces a setting signal at an output connected to a setting input of the counter. The setting signal is active when the stop signal is active or when the reset signal is active.

BRIEF DESCRIPTION OF THE DRAWINGS

The invention will be understood more clearly and other features and advantages will appear from the following description, made with reference to the appended drawings, of which:

FIG. 1 is a functional block diagram of a prior art phase-locked loop type clock signal generator;

FIGS. 2a–2d and 3a–3d are timing diagrams of signals at different points within the generator illustrated in FIG. 1;

FIG. 4 is a functional block diagram of a generator according to the invention;

FIGS. 5a–5d are timing diagrams of signals at different points within the generator illustrated in FIG. 4.

DETAILED DESCRIPTION OF THE PREFERRED EMBODIMENTS

Figure 6A:
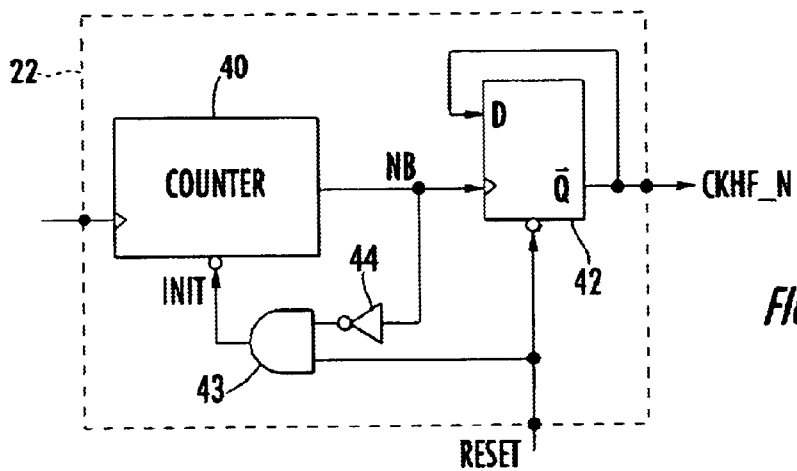
FIGS. 6a–6c are schematic diagrams of the various functional block circuits illustrated in FIG. 4.

A phase-locked loop type of clock-signal generator 20 according to the invention comprises, according to FIG. 4, a frequency divider 22, a phase comparator 24, an oscillator 26 and a reset circuit 28. The generator 20 produces a high-frequency clock signal CKHF with a frequency FHF from a reference signal CKBF with a frequency FBF.

The frequency divider 22 has a data input and a reset input to which the signal CKHF and a reset signal RESET are applied respectively. At a data output, the frequency divider 22 gives a low-frequency signal CKHF_N that is an image of the signal CKHF. The frequency of CKHF_N is equal to FHF/N, with N being an integer, and the phase of CKHF_N is fixed by the signal RESET.

FIG. 6a shows an embodiment of the frequency divider 22 according to the invention. It has an n-bit counter 40, a D-type flip-flop circuit 42, an AND type logic gate 43 and an inverter 44.

The counter 40 comprises a clock input to which the clock signal CKHF is applied, and a setting input to which a setting signal INIT is applied. The counter 40 counts the pulses of the signal CKHF and, at an output terminal, it gives a stop signal NB having the following characteristics. NB becomes active, for example, equal to 1, when the number of pulses counted is equal to N/2. NB becomes inactive, for example, equal to 0, when the signal INIT is received by the counter 40.

The D-type flip-flop circuit 42 comprises a clock input connected to the output of the counter 40, a reset input to which the signal RESET is applied, a negative date output/Q connected to the output of the divider 22, and a data input D. The flip-flop circuit 42 gives a logic signal whose value is modified at each activation of the stop signal NB. In other words, the flip-flop circuit 42 gives a clock signal with a frequency FHF/N (passage from 1 to 0 and then from 0 to 1 during one period of CKHF_N).

The AND type logic gate 43 has two inputs. One input is connected to the reset input of the divider 22 to receive the signal RESET, and the other input is connected to the output of the counter 40 by the inverter 44. The gate 43 gives the signal INIT which has the following characteristics: INIT is active, for example, equal to 0, if the reset signal RESET is active (0) or if the stop signal NB is active (1). Otherwise, INIT is inactive, for example, equal to 1.

The signal INIT is used to set the counter 40 at zero when the number N/2 is reached or when an active reset signal RESET is received. In other words, the signal INIT is used to cancel the phase of the signal CKHF_N when an active signal RESET is received. That is, to synchronize the signal CKHF_N with the signal CKBF.

The phase comparator 24 has a positive data input, a negative data input and a reset input to which the low-frequency signal CKHF_N, the reference signal CKBF and the reset signal RESET are applied respectively. When the signal RESET is inactive, the comparator 24 operates identical to the prior art comparator 14. Thus, when the signal CKHF_N and CKBF are equal to one, the comparator 24 detects the trailing edges of these signals, compares their phase and, at two data outputs, provides two control signals UP, DOWN, which are active (for example, equal to one) or inactive (for example, equal to 0) depending on the result of the comparison. However, when an active reset signal RESET is received by the comparator 24, the signals UP, DOWN are deactivated (UP=0, DOWN=0) or kept inactive as the case may be.

Figure 6B:
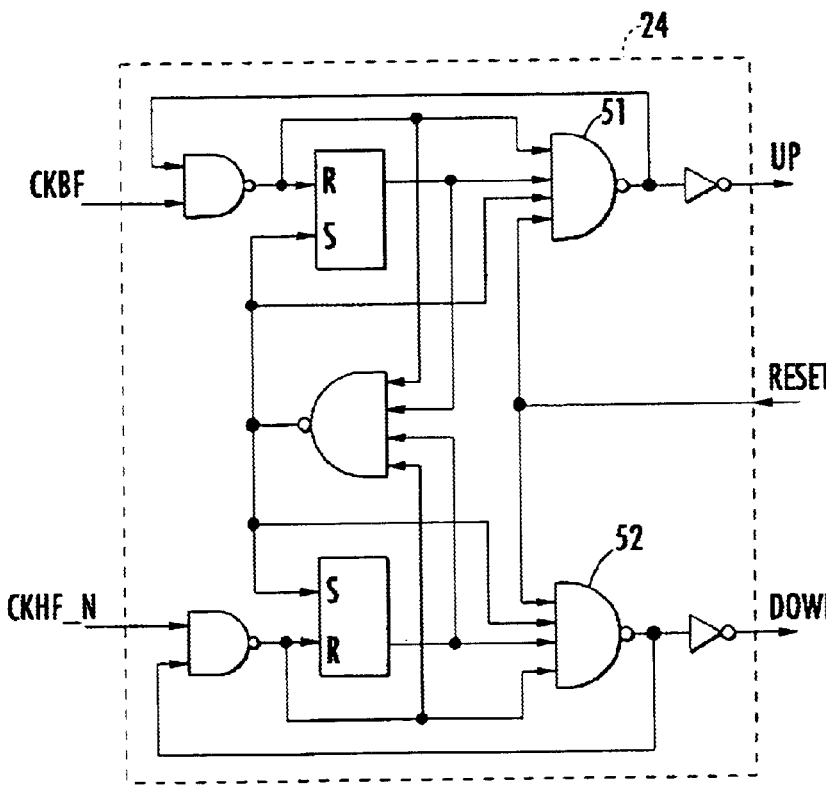

An exemplary embodiment of the comparator 24 is shown in FIG. 6b. As compared with existing comparators, used for example in the generator of FIG. 1, the comparator 24 comprises reset means to deactivate the control signals UP, DOWN (or, as the case may be, to keep them inactive) when the active reset signal RESET is received.

In the example of FIG. 6b, the reset means comprises two NAND gates 51, 52 with four inputs instead of three. The signal RESET is applied to one of the inputs of the gates 51, 52. Thus, if the signal RESET is active, for example, equal to 0, then the signals UP, DOWN are necessarily equal to 0. That is, they are inactive regardless of the values of the signals applied to the other inputs of the gates 51, 52.

The oscillator 26 is identical to the oscillator 16 of FIG. 1. It may be of the analog or digital type. The oscillator 26 produces the signal CKHF, whose frequency FHF varies as a function of the control signals UP, DOWN: $\Delta FHF=K*\Delta UP$ or $\Delta AF=K*\Delta DOWN$.

The reset circuit 28 has two inputs to which there are respectively applied the signals CKBF, CKHF. The circuit 28 detects the leading edges of the signal CKBF and produces the reset signal RESET which has following characteristics. RESET becomes active, for example, equal to 0, whenever a leading edge of CKBF is detected. RESET is kept active up to the detection of a leading edge of the signal CKHF. RESET is inactive, for example, equal to one, when no leading edge of CKBF is detected.

Figure 6C:
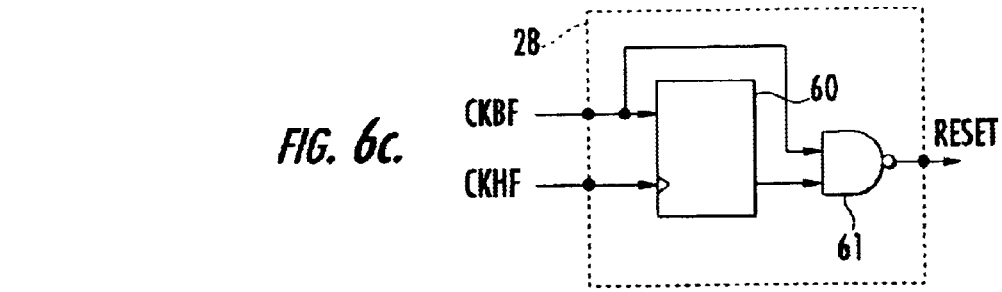

An exemplary reset circuit 28 according to the invention is described in detail in FIG. 6c. This reset circuit has the D-type flip-flop circuit 60 and a NAND type logic gate 61. The flip-flop circuit 60 has a data input D and a clock input to which the signals CKBF and CKHF are applied respectively. The gate 61 has two inputs respectively connected to the data input and to a negative input/Q of the flip-flop circuit 60. The signal RESET is given at an output of the logic gate 61. Reset circuits other than that of FIG. 6c may of course be used. What is essential is that there should be a circuit available that produces the active signal RESET at every leading edge of the signal CKBF.

The general operation of the circuit of FIG. 4 shall now be described with reference to FIGS. 5a to 5d which are timing diagrams of the signals CKBF, RESET, and CKBF_N, UP. In the example it is assumed that, initially, the reference signal CKBF is zero, and that the control signals are inactive, namely UP=0, DOWN=0, RESET=1.

At the instant the $\Delta 0$, the signal CKBF goes to 1. The reset circuit 28 detects the leading edge of the signal CKBF and gives an active signal RESET (equal to 0) that resets the frequency divider 22 and the phase comparator or 24. The signal CKHF_N is synchronized with the signal CKBF and goes to 1. The control signals UP, DOWN are kept inactive, and equal to 0. The frequency FHF of the signal CKHF at the output of the oscillator 26 is very low, for example, in the range of the reference signal CKBF. The frequency FHF is therefore below its borderline value FHF0, and the frequency of CKHF_N is lower than that of CKBF.

At the instant $\Delta 1$, the phase comparator 24 detects a trailing edge of the signal CKBF, which indicates that the signal CKBF has a phase lead with respect to the signal CKHF_N, namely that the frequency FHF is lower than its borderline value FHF0. The comparator 24 then gives an active signal UP. Since UP=1, the frequency FHF of the signal CKHF produced by the oscillator 26 increases.

At the instant $\Delta 2$, the reset circuit 28 detects a leading edge of the signal CKBF and gives an active signal RESET that resets the frequency divider 22 and the phase comparator 24. The signal CKHF_N is held equal to 1 and it is resynchronized with the signal CKBF. The signal UP for its part is deactivated (equal to 0).

At the instant $\Delta 3$, the phase comparator 24 detects a trailing edge of the signal CKBF, indicating that the frequency FHF is still below its borderline value FHF0. The comparator then gives an active signal UP, and the frequency FHF of the signal CKHF produced by the oscillator 28 rises.

At the instant $\Delta 4$, the comparator 24 detects a trailing edge of the signal CKHF_N and deactivates the signal UP (UP=0). Since UP, DOWN are inactive, the frequency of the signal CKHF is kept constant.

At the instant $\Delta 5$, a leading edge of the signal CKBF is detected by the reset circuit 28 and therefore produces an active signal RESET (RESET=0), which resets the frequency divider 22 and the comparator 24. Consequently, the signal CKHF_N is synchronized with the signal CKBF and takes the value 1. The signal UP for its part is kept inactive.

At the instant $\Delta 6$, the comparator 24 detects a trailing edge of the signal CKBF, indicating that the frequency of CKHF is still below the value of FHF0. The comparator 24 then produces a signal UP=1, and the frequency of the signal CKHF increases.

The frequency FHF of the signal CKHF will thus increase gradually from its initial value to its borderline value FHF0. It will be noted that the duration of the pulses UP ($\Delta 2-\Delta 1$, $\Delta 4-\Delta 3$), which determines the increase $\Delta FHF$ of the frequency FHF, is proportional to the difference in frequency between the frequency of the signal CKBF and the frequency of the signal CKHF_N. That is, between the frequency FHF0 and the real frequency FHF. Since the signal CKHF_N is synchronized with the signal CKBF at each new leading edge of CKBF, the phase difference between two trailing edges immediately following the synchronized leading edges is directly proportional to the difference between the frequency FHF and its borderline value FHF0.

This has the following consequences. The duration of the pulses UP (or DOWN) decreases when the frequency FHF increases (or decreases) and approaches its borderline value FHF0. If initially the frequency FHF is lower than its borderline value FHF0, then there are no pulses DOWN, and FHF increases constantly with UP but remains below FHF0, at least until convergence. Conversely, if initially FHF is higher than FHF0, then there are only pulses DOWN, and FHF decreases constantly but remains higher than FHF0.

Thus, with the invention, the variations $\Delta FHF$ of the frequency FHF are managed with the utmost efficiency as a function of the real value of the frequency FHF with respect to its borderline value FHF0. Modifications may be made in the circuit of FIGS. 4 and 6 without going beyond the scope of the invention.

The signal RESET will not be used to reset the phase comparator 24. The signal RESET is applied to the comparator 24 to deactivate the control signals UP, DOWN. In the exemplary operation of FIG. 5, the signal RESET is thus used to deactivate the signal UP especially at the instant $\Delta 2$. This is not indispensable since, in all cases, the signals UP are deactivated by the appearance of the trailing edges of CKHF_N and the signal DOWN by the appearance of trailing edges of CKBF. Thus, to implement the invention, it is enough to use the signal RESET to reset the divider 22. That is, to synchronize the signals CKHF_N, CKBF.

The counter 40 in the described example is set at zero by the setting signal INIT and it is incremented at each pulse of the signal CKHF. It is also possible to use a counter which is set at a maximum value by the setting signal INIT and is decremented at each pulse of the signal CKHF.

Furthermore, as seen above, with the invention only one control signal UP or DOWN is used, although the phase comparator 24 produces two control signals. However, it is possible to use a comparator producing only one control signal.

In one variation, the frequency FHF is compared with its borderline value when the generator starts up. If, when the generator starts up, FHF<FHF0, then the comparator produces only pulses UP and the elements of the comparator 24 that produce the signal DOWN are deactivated. Conversely, if FHF>FHF0, then the elements of the phase comparator 24 which produce the pulses UP are deactivated.

In another variation, the comparator gives only one control signal U/D which, for example, has the following characteristics: U/D=1 if FHF is lower than FHF0, and U/D=0 if not. The generator operates in this case similarly to the generator of FIG. 4. Simply, the frequency FHF varies permanently. It increases when U/D=1and diminishes when U/D=0.

Finally, it is possible to improve the clock signal generator 20 of FIG. 4 by adding means 32 to drive the oscillator 26 and a flip-flop circuit 30 (which may be part of the frequency divider 22) comprising a clock input, a D input, an n-bit parallel data Q output, with n being the size of the binary numbers given by the counter 20 of the frequency divider 22.

The D input of the flip-flop circuit 30 is connected to a parallel output of the counter 40, and its Q output is connected to an n-bit control input of the oscillator 26 that is connected to the driving means. Finally, the reference signal CKBF is applied to the clock input of the flip-flop circuit 30 by an inverter I.

As seen above, the counter is activated especially by a leading edge of the reference signal CKBF (which drives an active signal RESET, for example, at the instant $\Delta 0$ in FIGS. 5a to 5d) and it counts the leading edges of the signal CKHF. The counter 40 gives the number of pulses counted at its parallel output. The flip-flop circuit 30 receives the number of pulses counted and sends a number NC to the driving means 32 on a trailing edge of the signal CKBF (the instant $\Delta 1$ in FIGS. 5a to 5d). The number NC is equal to the number of pulses of the signal CKHF counted between a leading edge and a trailing edge of the signal CKF. That is, during a half period of the reference signal CKBF.

The number NC has the following characteristics. NC=N/2 if FHF is equal to its borderline value FHF0, and NC<N/2 if FHF is smaller than FHF0. The number NC cannot be greater than N/2 inasmuch as the counter 40 is setting regardless of the value N/2.

As illustrated above, regardless of the oscillator chosen, whether analog or digital, the variation $\Delta$FHF in the frequency FHF caused by a pulse UP, DOWN is proportional to the duration $\Delta$UP, $\Delta$DOWN of the signal UP, DOWN applied: $\Delta AF=K*\Delta UP$ or $\Delta AF=K*\Delta DOWN$.

The driving means 32 operates as follows. If NC is very different from N/2 (greater than our smaller than N/2), i.e., if the frequency FHF is very different from its desired value FHF0, then the driving means increase the value of the coefficient of proportionality K. Conversely, it NC is close to N/2 (higher or lower), i.e., if the frequency FHF is close to its desired value FHF0, then the driving means 32 reduces the value of the coefficient of proportionality K.

Thus, the driving means 32 obtains a substantial variation in the frequency FHF if it is very different from its borderline value or, on the contrary, they make the value FHF vary slowly when it is close to its borderline value. The driving means 32 therefore provides for the efficient management of the variations of the frequency FHF, and therefore, for reducing the convergence time, namely the time needed to obtain the desired frequency FHF0.

According to one variation, the coefficient K is made to vary linearly as a function of the difference NC-N/2. According to another variation, the coefficient K takes a first value when the difference NC-N/2 is smaller, in terms of absolute value, than a threshold. If not, it takes a second value. Other variations may of course be planned. The essential point is that the variations of the coefficient of proportionality K must be modulated as a function of the difference NC-N/2. The practical embodiment of the driving means 32 obviously depend on the type of oscillator chosen.

That which is claimed is:

1. A signal generator comprising:
    a frequency divider for providing a low-frequency signal that is based upon a high-frequency output signal, and for providing a driving signal representative of a frequency of the high-frequency output signal;
    a comparator connected to said frequency divider for comparing a phase of the low-frequency signal with a phase of a reference signal, and for providing at least one control signal having a duration based upon the comparison;
    oscillator driving means connected to said frequency divider for receiving the driving signal, and for modulating a value of a coefficient of proportionality based upon a difference between the frequency of the high-frequency output signal and a desired frequency;
    an oscillator connected to said comparator and to said oscillator driving means for providing the high-frequency output signal having a frequency based upon the duration of the at least one control signal multiplied by the coefficient of proportionality; and
    a reset circuit connected to said frequency divider and to said phase comparator for providing a reset signal at each leading edge of the reference signal for synchronizing the low-frequency signal with the reference signal.

2. A signal generator according to claim 1, wherein said frequency divider has a reset input for receiving the reset signal.

3. A signal generator according to claim 1, wherein said comparator has an input for receiving the reset signal for deactivating the at least one control signal at each leading edge of the reference signal.

4. A signal generator according to claim 1, wherein said reset circuit comprises:
    a first flip-flop circuit comprising a data input for receiving the reference signal, and an input for receiving the high-frequency output signal; and
    a first logic gate having a first input connected to the data input of said first flip-flop circuit, a second input connected to a data output of said first flip-flop circuit, and an output for providing the reset signal.

5. A signal generator according to claim 1, wherein said frequency divider comprises:
    a counter for counting pulses of the high-frequency output signal and for providing a stop signal when a number of counted pulses reaches a first number;
    a second flip-flop circuit having an input for receiving the stop signal, a data input, and an output connected to the data input and for providing the low-frequency signal;
    an inverter having an input for receiving the stop signal; and
    a second logic gate having a first input connected to an output of said inverter for receiving the stop signal, a second input for receiving the reset signal, and an output connected to said counter for providing a setting signal thereto.

6. A signal generator according to claim 5, wherein the setting signal is active when at least one of the stop and reset signals are active.

7. A signal generator according to claim 5, wherein said second flip-flop circuit has an input for receiving the reset signal.

8. A signal generator according to claim 5, wherein said frequency divider further comprises a third flip-flop circuit connected between said counter and said oscillator driving means for providing a binary number equal to the number of counted pulses in the high-frequency output signal during a half-period of the reference signal and representing the frequency of the high-frequency output signal.

9. A signal generator according to claim 8, wherein said oscillator driving means increases the value of the coefficient of proportionality if the binary number is significantly different from a desired number, and reduces the value of the coefficient of proportionality if the binary number is close to the desired number.

10. A signal generator according to claim 8, wherein said oscillator driving means linearly modulates the coefficient of proportionality as a function of a difference between the binary number and a desired number.

11. A signal generator according to claim 8, wherein said oscillator driving means modulates the coefficient of proportionality so that the coefficient of proportionality takes a first value when an absolute value of a difference between the binary number is less than a threshold, otherwise the coefficient of proportionality takes a second value.

12. A signal generator according to claim 1, wherein said frequency divider, said comparator, said oscillator driving means, said oscillator and said reset circuit form an integrated circuit.

13. A signal generator comprising:
a frequency divider for providing a low-frequency signal based upon a high-frequency output signal, and for providing a driving signal representative of a frequency of the high-frequency output signal;
a comparator connected to said frequency divider for comparing a phase of the low-frequency signal with a phase of a reference signal, and for providing at least one control signal having a duration based upon the comparison;
an oscillator driving circuit connected to said frequency divider for receiving the driving signal, and for modulating a value of a coefficient of proportionality based upon a difference between the frequency of the high-frequency output signal and a desired frequency;
an oscillator connected to said comparator and to said oscillator driving circuit for providing the high-frequency output signal having a frequency based upon the duration of the at least one control signal multiplied by the coefficient of proportionality; and
a reset circuit connected to said frequency divider and to said phase comparator for providing a reset signal based upon the reference signal for synchronizing the low-frequency signal with the reference signal.

14. A signal generator according to claim 13, wherein said frequency divider has a reset input for receiving the reset signal.

15. A signal generator according to claim 13, wherein said reset circuit provides the reset signal at each leading edge of the reference signal; and wherein said comparator has an input for receiving the reset signal for deactivating the at least one control signal at each leading edge of the reference signal.

16. A signal generator according to claim 13, wherein said reset circuit comprises:
a first flip-flop circuit comprising a data input for receiving the reference signal, and an input for receiving the high-frequency output signal; and
a first logic gate having a first input connected to the data input of said first flip-flop circuit, a second input connected to a data output of said first flip-flop circuit, and an output for providing the reset signal.

17. A signal generator according to claim 13, wherein said frequency divider comprises:
a counter for counting pulses of the high-frequency output signal and for providing a stop signal when a number of counted pulses reaches a first number;
a second flip-flop circuit having an input for receiving the stop signal, a data input, and an output connected to the data input and for providing the low-frequency signal;
an inverter having an input for receiving the stop signal; and
a second logic gate having a first input connected to an output of said inverter for receiving the stop signal, a second input for receiving the reset signal, and an output connected to said counter for providing a setting signal thereto.

18. A signal generator according to claim 17, wherein said second flip-flop circuit has an input for receiving the reset signal.

19. A signal generator according to claim 17, wherein said frequency divider further comprises a third flip-flop circuit connected between said counter and said oscillator driving circuit for providing a binary number equal to the number of counted pulses in the high-frequency output signal during a half-period of the reference signal and representing the frequency of the high-frequency output signal.

20. A signal generator according to claim 19, wherein said oscillator driving circuit increases a value of the coefficient of proportionality if the binary number is significantly different from a desired number, and reduces the value of the coefficient of proportionality if the binary number is close to the desired number.

21. A signal generator according to claim 19, wherein said oscillator driving circuit linearly modulates the coefficient of proportionality as a function of a difference between the binary number and a desired number.

22. A signal generator according to claim 19, wherein said oscillator driving circuit modulates the coefficient of proportionality so that the coefficient of proportionality takes a first value when an absolute value of a difference between the binary number is less than a threshold, otherwise the coefficient of proportionality takes a second value.

23. A clock signal generator comprising:
a frequency divider for providing a low-frequency signal based upon a high-frequency clock signal, and for providing a driving signal representative of a frequency of the high-frequency output signal;
a comparator connected to said frequency divider for comparing a phase of the low-frequency signal with a phase of a reference signal, and for providing at least one control-signal having a duration based upon the comparison;
an oscillator driving circuit connected to said frequency divider for receiving the driving signal, and for modulating a value of a coefficient of proportionality based upon a difference between the frequency of the high-frequency output signal and a desired frequency;
an oscillator connected to said comparator and to said oscillator driving circuit for providing the high-frequency clock signal having a frequency based upon the duration of the at least one control signal multiplied by a the coefficient of proportionality; and a reset circuit connected to said frequency divider and to said phase comparator for providing a reset signal at each leading edge of the reference signal for synchronizing the low-frequency signal with the reference signal, said reset circuit comprising a first flip-flop circuit comprising a data input for receiving the reference signal, and an input for receiving the high-frequency clock signal, and a first logic gate having a first input connected to the data input of said first flip-flop circuit, a second input connected to a data output of said first flip-flop circuit, and an output for providing the reset signal.

24. A clock signal generator according to claim 23, wherein said comparator has an input for receiving the reset signal for deactivating the at least one control signal at each leading edge of the reference signal.

25. A clock signal generator according to claim 23, wherein said frequency divider comprises:

a counter for counting pulses of the high-frequency clock signal and for providing a stop signal when a number of counted pulses reaches a first number;

a second flip-flop circuit having an input for receiving the stop signal, a data input, and an output connected to the data input and for providing the low-frequency signal;

an inverter having an input for receiving the stop signal; and a second logic gate having a first input connected to an output of said inverter for receiving the stop signal, a second input for receiving the reset signal, and an output connected to said counter for providing a setting signal thereto.

26. A clock signal generator according to claim 25, wherein said frequency divider further comprises a third flip-flop circuit connected between said counter and said oscillator for providing a binary number for equal to the number of counted pulses in the high-frequency output signal during a half-period of the reference signal and representing the frequency of the high-frequency clock signal.

27. A clock signal generator according to claim 26, wherein said oscillator driving circuit increases a value of the coefficient of proportionality if the binary number is significantly different from a desired number, and reduces the value of the coefficient of proportionality it the binary number is close to the desired number.

28. A clock signal generator according to claim 26, wherein said oscillator driving circuit linearly modulates the coefficient of proportionality as a function of a difference between the binary number and a desired number.

29. A clock signal generator according to claim 26, wherein said oscillator driving circuit modulates the coefficient of proportionality so that the coefficient of proportionality takes a first value when an absolute value of a difference between the binary number is less than a threshold, otherwise the coefficient of proportionality takes a second value.

30. A method for generating a high-frequency output signal comprising:

providing a low-frequency signal based upon the high-frequency output signal;

providing a driving signal representative of a frequency of the high-frequency output signal comparing a phase of the low-frequency signal with a phase of a reference signal, and providing at least one control signal having a duration based upon the comparison;

receiving the driving signal at an input of an oscillator driving circuit, and modulating a value of a coefficient of proportionality based upon a difference between the frequency of the high-frequency output signal and a desired frequency;

providing the high-frequency output signal using an oscillator connected to the oscillator driving circuit for providing a frequency based upon the duration of the at least one control signal multiplied by the coefficient of proportionality; and providing a reset signal at each leading edge of the reference signal for synchronizing the low-frequency signal with the reference signal.

31. A method according to claim 30, further comprising deactivating the at least one control signal at each leading edge of the reference signal based upon the reset signal.

32. A method according to claim 30, wherein providing the reset signal comprises:

providing the reference signal to a data input of a first flip-flop circuit, and providing the high-frequency output signal to a second input of the first flip-flop circuit; and performing a logic function using a first logic gate having a first input connected to the data input of the first flip-flop circuit, a second input connected to a data output of the first flip-flop circuit, and an output for providing the reset signal.

33. A method according to claim 30, wherein providing the low-frequency signal comprises:

counting pulses of the high-frequency signal using a counter for providing a stop signal when a number of counted pulses reaches a first number;

using a second flip-flop circuit having an input for receiving the stop signal, a data input, and an output connected to the data input and for providing the low-frequency signal;

inverting the stop signal; and using a second logic gate having a first input for receiving an inverted stop signal, a second input for receiving the reset signal, and an output connected to the counter for providing a setting signal thereto.

34. A method according to claim 33, wherein a third flip-flop is connected between the counter and the oscillator driving circuit for providing a binary number equal to the number of counted pulses in the high-frequency output signal during a half-period of the reference signal and representing f the frequency of the high-frequency output signal.

35. A method according to claim 34, wherein the oscillator driving circuit increases a value of the coefficient of proportionality if the binary number is significantly different from a desired number, and reduces the value of the coefficient of proportionality if the binary number is close to the desired number.

36. A method according to claim 34, wherein the oscillator driving circuit linearly modulates the coefficient of proportionality as a function of a difference between the binary number and a desired number.

37. A method according to claim 34, wherein the oscillator driving circuit modulates the coefficient of proportionality so that the coefficient of proportionality takes a first value when an absolute value of a difference between the binary number is less than a threshold, otherwise the coefficient of proportionality takes a second value.

* * * * *

UNITED STATES PATENT AND TRADEMARK OFFICE
CERTIFICATE OF CORRECTION

PATENT NO. : 6,703,880 B1
DATED : March 9, 2004
INVENTOR(S) : Bruno Gailhard and Olivier Ferrand It is certified that error appears in the above-identified patent and that said Letters Patent is hereby corrected as shown below:

Column 2,
Line 28, delete "$\Delta AND$" insert -- $\Delta ND$ --
Line 41, delete "or $\Delta AF$" insert -- or $\Delta F$ --
Lines 44 and 52, delete "Ti" insert -- T1 --

Column 3,
Line 15, delete "$\delta$" insert -- $\delta F$ --

Column 7,
Line 12, delete "or $\Delta AF$" insert -- or $\Delta F$ --

Column 9,
Line 49, delete "$\Delta AF=K*\Delta UP$ or $\Delta AF=K*\Delta DOWN$" insert -- $\Delta F=K*\Delta UP$ or $\Delta F=K*\Delta DOWN$ --

Column 14,
Line 48, delete "representing f the" insert -- representing the --

Signed and Sealed this

Third Day of August, 2004

JON W. DUDAS
*Acting Director of the United States Patent and Trademark Office*